United States Patent
Fahim et al.

(10) Patent No.: US 7,348,839 B2
(45) Date of Patent: Mar. 25, 2008

(54) METHOD AND APPARATUS FOR DC OFFSET CANCELLATION IN AMPLIFIERS

(75) Inventors: Amr Fahim, Newport Beach, CA (US);
Hassan Elwan, Lake Forest, CA (US);
Aly Ismail, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 0 days.

(21) Appl. No.: 11/466,465

(22) Filed: Aug. 23, 2006

(65) Prior Publication Data
US 2008/0048773 A1 Feb. 28, 2008

(51) Int. Cl.
*H03F 1/02* (2006.01)
(52) U.S. Cl. ............................................. 330/9; 330/69
(58) Field of Classification Search .................... 330/9, 330/69, 310, 98, 150
See application file for complete search history.

(56) References Cited

U.S. PATENT DOCUMENTS 3,810,031 A * 5/1974 Poujois .......................... 330/6
6,911,864 B2 * 6/2005 Bakker et al. ................. 330/9
7,262,654 B2 * 8/2007 Kejariwal et al. ............. 330/9

* cited by examiner

*Primary Examiner*—Henry Choe
(74) *Attorney, Agent, or Firm*—Gibb & Rahman, LLC; Mohammad S. Rahman, Esq.

(57) ABSTRACT

A system, circuit, and method of canceling DC offset errors in cascaded amplifiers comprises arranging a plurality of any of analog voltage and analog current amplifier stages in any of cascaded and parallel configurations; operatively connecting a feedback comparator and digital logic in a feedback path around a given amplifier, wherein the digital logic comprises a finite state machine implementing an adaptive search algorithm comprising fixed switching and modulated switching; operatively connecting a switch at a differential input of the amplifier to short both input terminals of the amplifier; performing fixed switching on binary weighted elements generating discrete analog steps used to vary any of DC offset voltage and current at the input of the amplifier; and performing modulated switching on at least one lower least significant bit (LSB) of all bits used to vary the any of the DC offset voltage and current.

25 Claims, 10 Drawing Sheets

METHOD AND APPARATUS FOR DC OFFSET CANCELLATION IN AMPLIFIERS

BACKGROUND

1. Technical Field

The embodiments herein generally relate to electrical circuits and systems, and, more particularly, to systems and methods for implementing DC offset cancellation in cascaded amplifiers.

2. Description of the Related Art

A typical front-end analog transceiver is composed of several gain and filter stages. The total gain can be well in excess of 60 dB. FIG. 1 shows a set of differential amplifiers 100 connected in a cascaded configuration (101-103). Due to random mismatches in electronic devices, such as metal oxide semiconductor (MOS) devices a parasitic DC offset can exist between the differential inputs of the first amplifier stage 101. A DC input offset error as high as 1 mV is not uncommon. With a cascaded gain of 60 dB, this would translate into 1V differential output, which is typically higher than the supply voltage. This would significantly reduce the dynamic range of the transceiver. Clearly a method of calibrating the DC offset error is required.

There are several DC offset error correction mechanisms discussed in the literature. DC offset cancellation strategies fall in one of two categories. In continuous DC offset 204 cancellation (as shown in FIG. 2), an AM loop around each amplifier is continuously running that measures the DC offset and adds/subtracts current and/or voltage by some active device to cancel the measured DC offset. Unfortunately, this method generally has several disadvantages. First, the loop continuously running is contributing to noise at the output of the amplifier 201, which is especially problematic for front-end amplifiers. Spurs can also be generated by the DC offset cancellation loop 200 by hard switching blocks such as comparators 202. Second, the closed loop response of the DC offset cancellation loop may interfere with the main amplifier, causing instability. Although this can be mitigated by ensuring that the DC offset loop bandwidth is much smaller than the main amplifier, this can be a difficult task for a cascade of amplifiers or it may necessitate large filters 203 necessary to lower the loop bandwidth. Third, since the DC offset cancellation loop 200 is always on, it may incur significant DC power consumption.

The other method of canceling DC offsets is by a digitally controlled loop 300, shown in FIG. 3. This is accomplished by having a digital control loop sweep through discrete DC steps (302-304) and determining which setting yields the minimum DC offset error. A digitally controlled loop 300 does not have the disadvantages of its analog counterpart, but it has its own shortcomings. First, since the DC cancellation loop is digital, it introduces a lot of switching noise at the output of the amplifier 301. One solution to this problem is to turn off the digital calibration loop once the DC offset cancellation loop has settled. Second, for very fine control over DC offset, very tight matching of the DC step size is required. This can result in an impractically large area for the DC offset calibration circuitry 304. For example, if a cascade of amplifiers of 60 dB is used and DC calibration is required, this would necessitate the use of fine DC steps sizes with 10-bit resolution (6 dB per bit). Accordingly, there remains a need for a digital DC offset error correction technique with high precision, especially in the context of a cascade of amplifiers.

SUMMARY

In view of the foregoing, an embodiment herein provides a method of canceling DC offset errors in cascaded amplifiers, wherein the method comprises arranging a plurality of any of analog voltage and analog current amplifier stages in any of cascaded and parallel configurations; operatively connecting a feedback comparator and digital logic in a feedback path around a given amplifier, wherein the digital logic comprises a finite state machine implementing an adaptive search algorithm comprising fixed switching and modulated switching; operatively connecting a switch at a differential input of the amplifier to short both input terminals of the amplifier; performing fixed switching on binary weighted elements generating discrete analog steps used to vary any of DC offset voltage and current at the input of the amplifier; and performing modulated switching on at least one lower least significant bit (LSB) of all bits used to vary the any of the DC offset voltage and current.

Preferably, the feedback comparator and the digital logic are configured around each the amplifier in a network of any of the cascaded and parallel amplifier stages. Additionally, the feedback comparator and the digital logic may be shared for each the amplifier in a network of any of the cascaded and parallel amplifier stages, wherein a first stage in a chain of amplifiers is calibrated first, followed by a second stage amplifier, up to a Nth stage in a cascade of N amplifier stages. Preferably, the modulating process is performed by any of a carry out signal of an accumulator clocked with a high-speed clock and by an output signal of a digital sigma-delta modulator, wherein the digital sigma-delta modulator may comprise any of a single-bit, multi-bit, MASH, single-loop, and any other digital sigma-delta modulator architecture. The method may further comprise using only one switch for shorting the differential input terminals of a first amplifier in a cascade of amplifiers, wherein during DC offset error cancellation, the switch is closed and a DC offset error cancellation algorithm is run on each amplifier in series starting from the first amplifier in a chain of amplifiers proceeding to a last amplifier.

Preferably, the adaptive search algorithm comprises any of a binary search algorithm and a linear search algorithm, wherein in the binary search algorithm, a most significant bit (MSB) is first asserted, wherein the adaptive search algorithm preferably runs such that if an output voltage is less than a reference mode voltage, then the MSB is deasserted, and preferably wherein if the output voltage is greater than the reference mode voltage, then the MSB is asserted. Additionally, the binary search algorithm preferably restarts with a second MSB and continues down to the LSB.

Another embodiment provides a circuit for canceling DC offset errors in cascaded amplifiers, wherein the circuit comprises a plurality of any of analog voltage and analog circuit amplifier stages arranged in any of cascaded and parallel configurations; a feedback path around a given amplifier, wherein the feedback path comprises a feedback comparator and digital logic, wherein the digital logic comprises a finite state machine implementing an adaptive search algorithm comprising fixed switching and modulated switching; and a switch operatively connected at a differential input of the amplifier to short both input terminals of the amplifier, wherein the fixed switching is performed on binary weighted elements generating discrete analog steps used to vary any of DC offset voltage and current at the input of the amplifier, and wherein the modulated switching is performed on at least one lower LSB of all bits used to vary the any of the DC offset voltage and current.

Preferably, the feedback comparator and the digital logic are configured around each amplifier in a network of any of the cascaded and parallel amplifier stages. Additionally, the feedback comparator and the digital logic may be shared for each the amplifier in a network of any of the cascaded and parallel amplifier stages, wherein a first stage in a chain of amplifiers is calibrated first, followed by a second stage amplifier, up to a Nth stage in a cascade of N amplifier stages. Furthermore, the modulating process may be performed by any of a carry out signal of an accumulator clocked with a high-speed clock and by an output signal of a digital sigma-delta modulator. Also, the digital sigma-delta modulator may comprise any of a single-bit, multi-bit, MASH, single-loop, and any other digital sigma-delta modulator architecture. Preferably, only one switch shorting the differential input terminals of a first amplifier in a cascade of amplifiers is used, and wherein during DC offset error cancellation, the switch is closed and a DC offset error cancellation algorithm is run on each amplifier in series starting from the first amplifier in a chain of amplifiers proceeding to a last amplifier. Moreover, the adaptive search algorithm may comprise any of a binary search algorithm and a linear search algorithm, wherein in the binary search algorithm, a MSB is first asserted. Also, the adaptive search algorithm preferably runs such that if an output voltage is less than a reference mode voltage, then the MSB is deasserted, wherein if the output voltage is greater than the reference mode voltage, then the MSB is preferably asserted. Furthermore, the binary search algorithm preferably restarts with a second MSB and continues down to the LSB.

Another embodiment provides a system for canceling DC offset errors in cascaded amplifiers, wherein the system comprises a signal generator; a plurality of any of analog voltage and analog circuit amplifier stages arranged in any of cascaded and parallel configurations and adapted to receive signals from the signal generator; a feedback path around a given amplifier, wherein the feedback path comprises a feedback comparator and digital logic, wherein the digital logic comprises a finite state machine implementing an adaptive search algorithm comprising fixed switching and modulated switching, wherein the feedback comparator and the digital logic are configured around each amplifier in a network of any of the cascaded and parallel amplifier stages, wherein the feedback comparator and the digital logic are shared for each amplifier in a network of any of the cascaded and parallel amplifier stages, wherein a first stage in a chain of amplifiers is calibrated first, followed by a second stage amplifier, up to a Nth stage in a cascade of N amplifier stages, wherein the adaptive search algorithm comprises any of a binary search algorithm and a linear search algorithm, wherein in the binary search algorithm, a MSB is first asserted; and a switch operatively connected at a differential input of the amplifier to short both input terminals of the amplifier, wherein the fixed switching is performed on binary weighted elements generating discrete analog steps used to vary any of DC offset voltage and current at the input of the amplifier, wherein the modulated switching is performed on at least one lower LSB of all bits used to vary the any of the DC offset voltage and current, and wherein the modulating process is performed by any of a carry out signal of an accumulator clocked with a high-speed clock and by an output signal of a digital sigma-delta modulator.

Preferably, the digital sigma-delta modulator comprises any of a single-bit, multi-bit, MASH, single-loop, and any other digital sigma-delta modulator architecture. Moreover, the adaptive search algorithm preferably runs such that if an output voltage is less than a reference mode voltage, then the MSB is deasserted. Preferably, if the output voltage is greater than the reference mode voltage, then the MSB is asserted. Furthermore, the binary search algorithm preferably restarts with a second MSB and continues down to the LSB.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
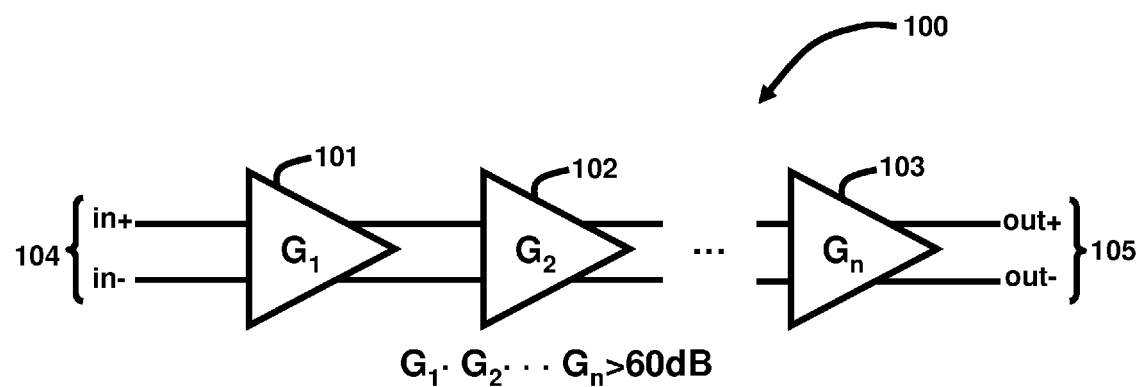
FIG. 1 illustrates a schematic diagram of a cascade of gain amplifiers.
Figure 2:
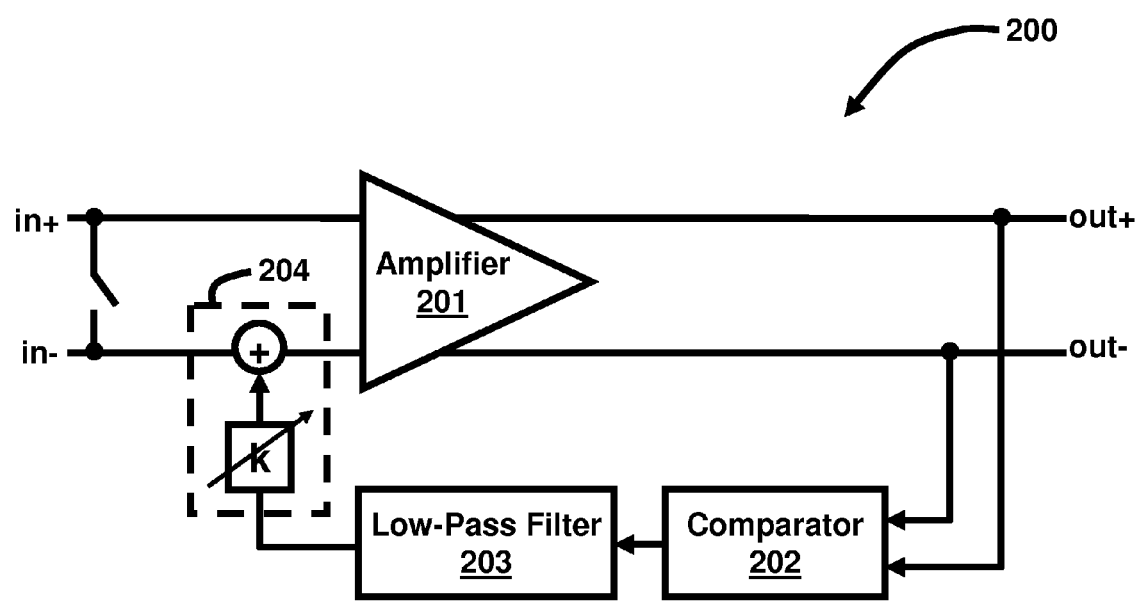
FIG. 2 illustrates a schematic diagram of a conventional continuous DC offset cancellation circuit.
Figure 3:
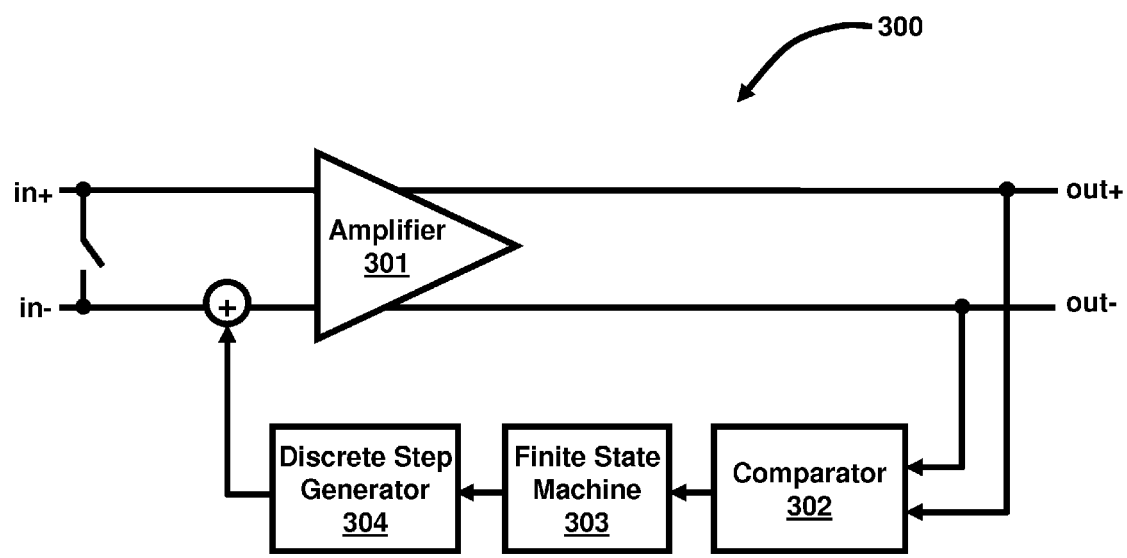
FIG. 3 illustrates a schematic diagram of a conventional digital DC offset cancellation circuit.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a digital DC offset error correction technique with high precision, especially in the context of a cascade of amplifiers. The embodiments herein achieve this by providing a technique for canceling undesired DC offsets that are problematic in a high-gain cascade of amplifiers. This is accomplished in the digital domain by a single efficient calibration engine that determines how much DC offset exists in each amplifier and adds an intentional canceling DC offset. Referring now to the drawings, and more particularly to FIGS. 4 through 10, where similar reference characters denote corresponding features consistently throughout the figures, there are shown preferred embodiments.

Figure 4:
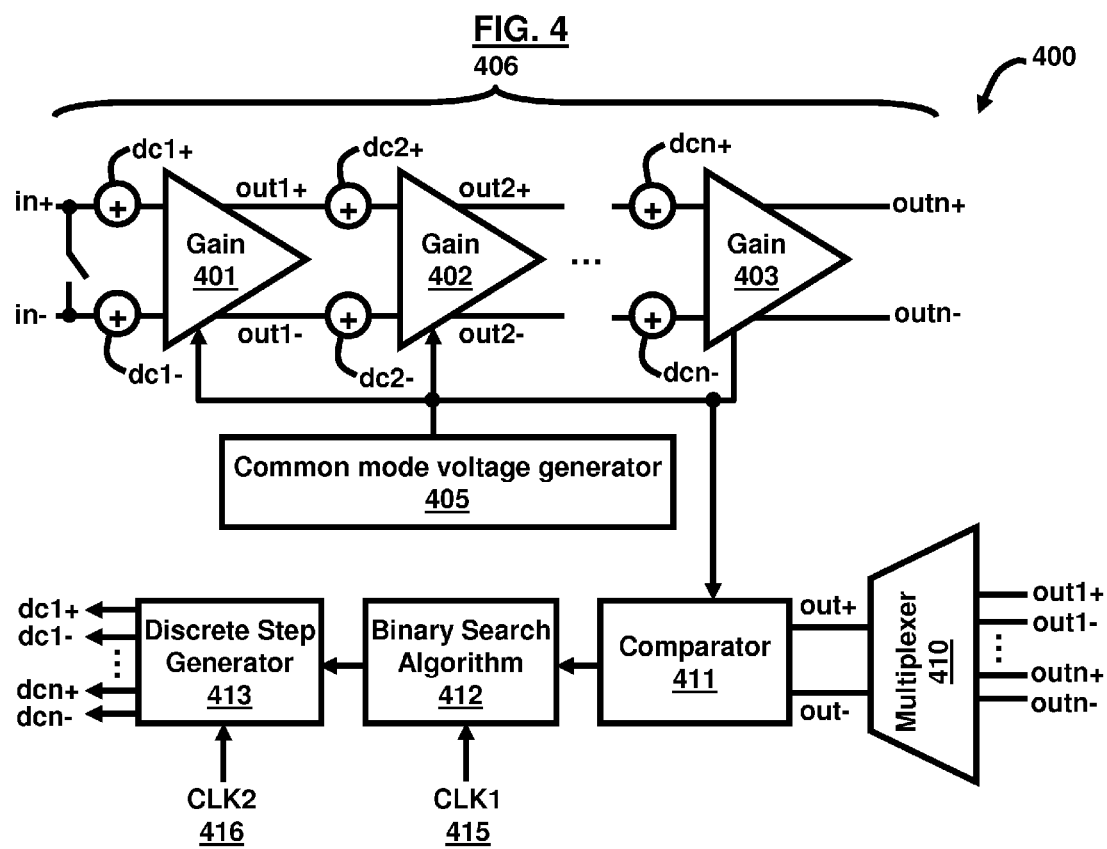
FIG. 4 illustrates a schematic diagram of a DC offset cancellation circuit according to an embodiment herein.

FIG. 4 illustrates the DC offset error correction mechanism 400 on a cascade of amplifier stages 401, 402, 403 according to an embodiment herein. A single digital DC offset correction loop 400 is inserted as a feedback loop around each amplifier stage 401, 402, 403. During system calibration, the DC offset errors are corrected. More specifically, the DC offset errors of each amplifier 401, 402, 403 are corrected sequentially starting from the input amplifier 401 in the cascade chain 406 and ending with the output amplifier 403.

Figure 5:
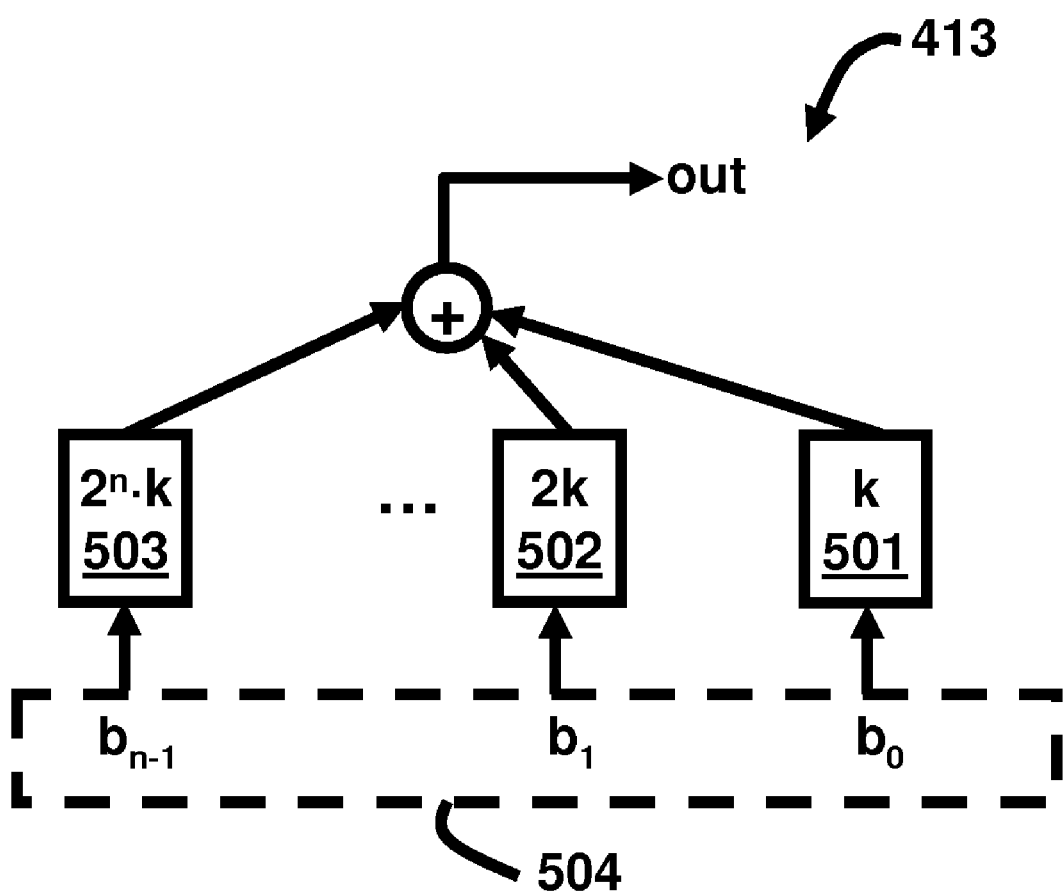
FIG. 5 illustrates a schematic diagram of a discrete step generator showing how bits are translated into analog discrete steps according to an embodiment herein.

With respect to FIGS. 4 and 5, the DC offset correction procedure of a single amplifier (401 or 402 or 403) follows a binary search algorithm 412. A discrete step generator 413 takes a digital word corresponding to a DC offset amplitude and drives passive or active binary weighted elements that have a unit element size corresponding to the required precision of the DC offset correction. Initially, the most significant bit (MSB) 503 of the DC offset tuning word 504 is set high and all other bits are set low. If the output of the comparator 411 is high, this means that the differential output of the amplifier (401 or 402 or 403) is larger than the common mode voltage of the amplifier (401 or 402 or 403). In this case, the MSB 503 is reset low and the second MSB 502 is set high. The procedure is restarted for the second MSB 502 all the way down to the least significant bit (LSB) 501. The clock (CLK1) 415 used to drive the binary search algorithm 412 is preferably lower than the amplifier's bandwidth such that sufficient time is given for the amplifier to settle to the correct voltage. Furthermore, CLK2 416 is used to drive the discrete step generator 413. It is preferable to allow the frequency of CLK2 416 to be much higher than that of CLK1 415 to allow oversampling and quantization noise shaping, as further explained below. In an alternate embodiment, the logic of the comparator 411 can be inverted in such a way that if the output is low, then this means that the differential output of the amplifier (401 or 402 or 403) is larger than the common mode voltage of the amplifier (401 or 402 or 403). Multiplexer 410 is used to allow each stage of the amplifier (401 or 402 or 403) to be tuned separately. A state machine (not shown in FIG. 4) first chooses the first amplifier 401 to be DC calibrated. This choice is performed by setting the multiplexer 410 to choose the outputs from the first amplifier 401 to be fed into the comparator 411. The state machine then chooses the second amplifier 402, and so on. The common mode voltage generator 405 enables a common mode voltage to be established for all differential amplifiers. This common mode may be used to determine where the "zero-crossing" point is in the comparator 411.

Figure 6:
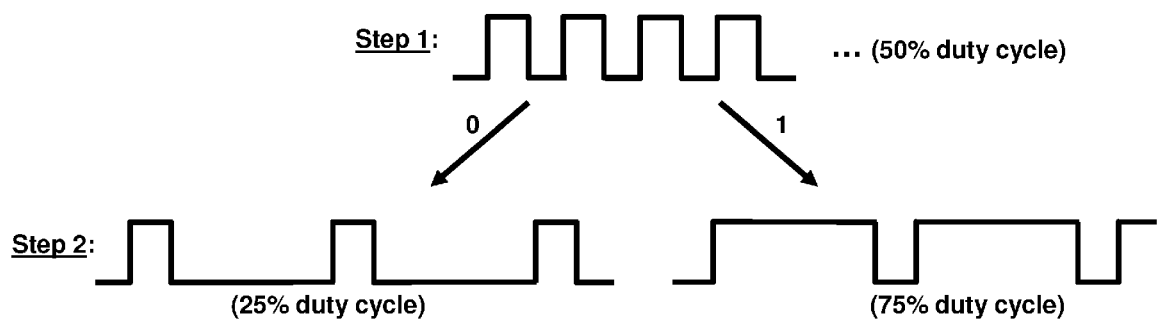
FIG. 6 is a schematic diagram illustrating how the LSB is dithered (modulated) during the fractional tuning word phase of the DC offset error correction circuit according to an embodiment herein.

After toggling all bits in the DC offset tuning word 504, the DC offset correction algorithm enters the "fractional tuning word" mode. In this mode, the LSB 501 is dithered (modulated) in such a way that the average value is initially one-half the value of the minimum resolution. The toggling rate of the LSB 501 is beyond the bandwidth of the amplifier (401 or 402 or 403). Since this is the case, the amplifier (401 or 402 or 403) will function as a low-pass filter, or average, the LSB dithering (modulating) to appear as a setting that is one-half the LSB. The same comparison procedure discussed above applies here as well. After tuning the 0.5LSB, the dithering duty cycle of the LSB 501 is changed to either 25% or 75% depending on the output of the 0.5LSB tuning, as shown in FIG. 6. As in its integer counterpart, the fractional binary search algorithm 412 searches from the MSB 503 to the LSB 501.

Figure 7A:
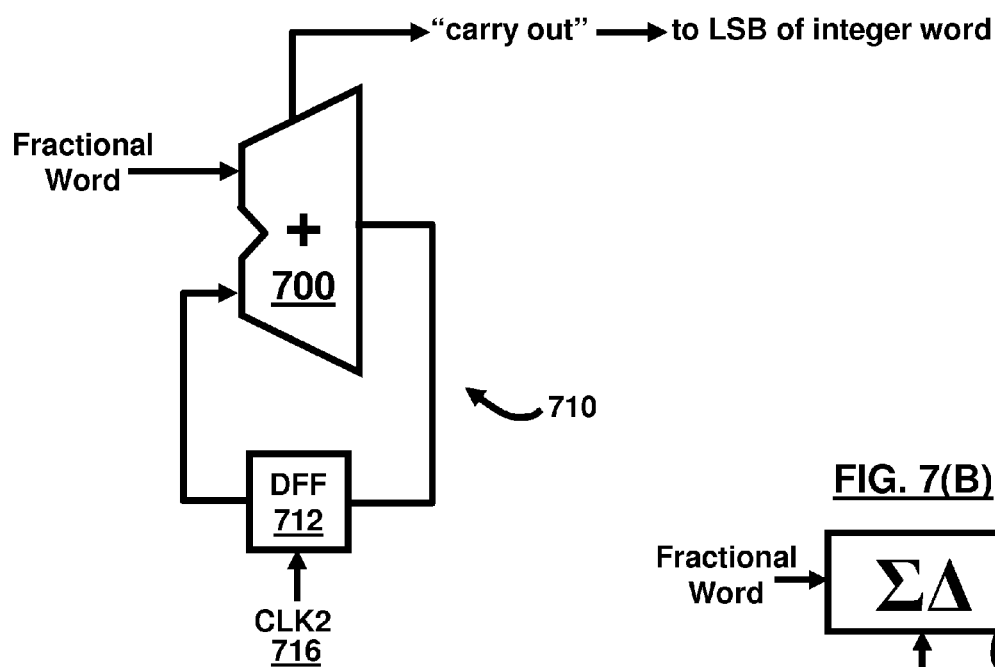
FIG. 7(A) illustrates a schematic diagram of the control circuitry for the fractional tuning word by an accumulator according to an embodiment herein.
Figure 7B:
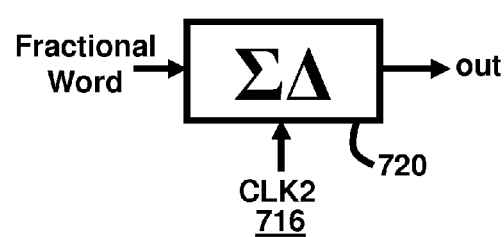
FIG. 7(B) illustrates a schematic diagram of the control circuitry for the fractional tuning word by a digital sigma-delta modulator according to an embodiment herein.

The dithering signal can be produced by a counter 700 "carry out" signal of a digital accumulator 710 or a digital sigma-delta modulator 720 as shown in FIGS. 7(A) and 7(B) respectively. When using an nth order sigma-delta modulator 720, care must be taken to ensure that the amplifier (401 or 402 or 403) is bandlimited with a $n+1^{th}$ order low-pass filter (not shown) to be able to attenuate the quantization noise produced by the sigma-delta modulator 720. The counter 700 is preferably embodied as a finite state machine used to produce an output with a controlled duty cycle. The input clock (CLK2) 716 to the modulating element 712 is preferably larger than the bandwidth of the amplifier (401 or 402 or 403) such that the spectral tones that it produces is attenuated by the amplifier's closed loop response.

Figure 8:
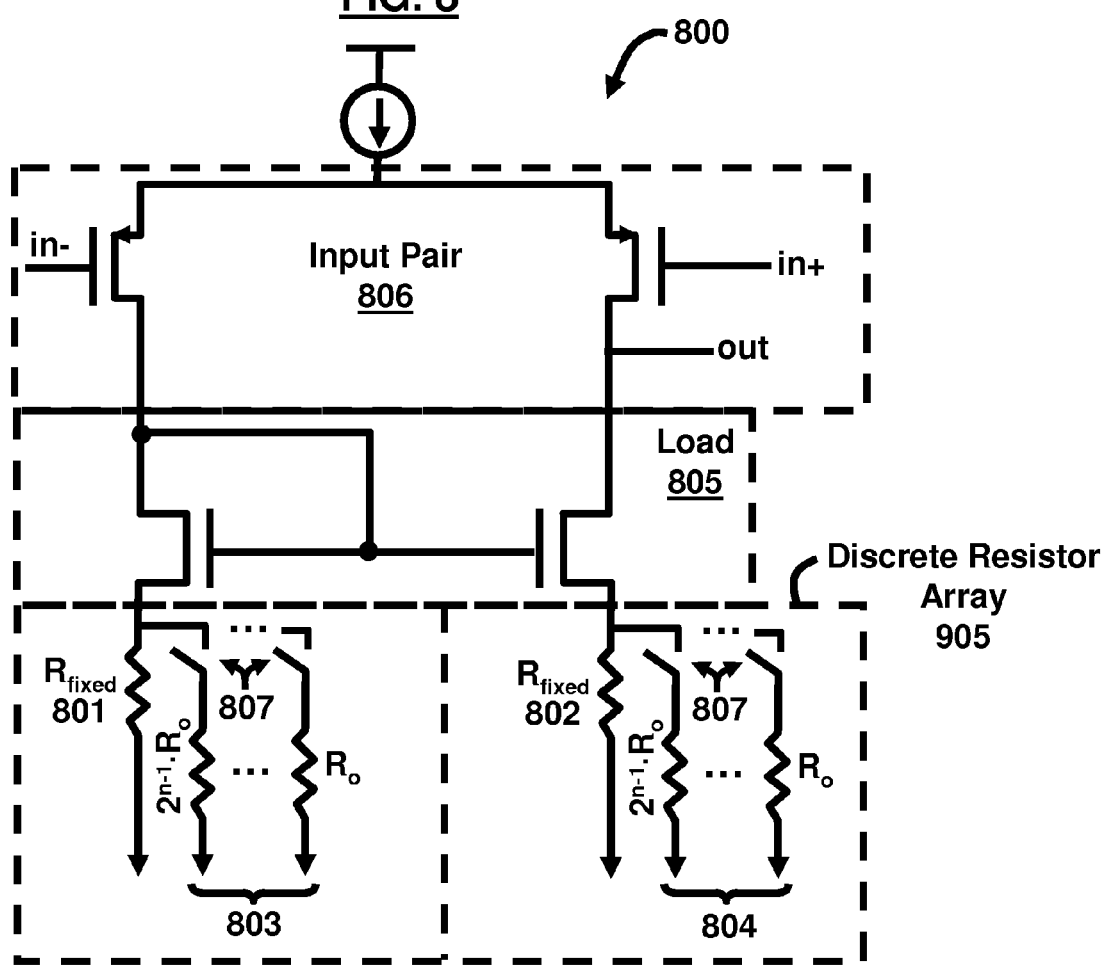
FIG. 8 illustrates a schematic diagram of a differential input single-ended output operational transconductance amplifier (OTA) employing a resistor array implementation of the discrete step generator according to an embodiment herein.

The network for obtaining discrete DC differential steps at the input of the amplifier can be realized in a number of ways. In one embodiment, it can be realized as a parallel combination of differential resistors at the load of a differential pair as shown in FIG. 8. This topology is suitable for differential input and single-ended output operational amplifiers 800. The reference resistor 801, 802 is always on and the switched resistances 803, 804 are binary weighted. In this implementation, the minimum resistance is defined as the parallel combination of all resistors 801-804 and is obtained when all switches 807 are ON. The maximum resistance is defined by the single fixed resistor 801 and is obtained when all switches 807 are OFF. The differential code words are coded in such a way that they are complementary. For example, if codeword of all zeros is applied to one side, this would select the maximum resistance. A codeword of all ones are applied to the alternate side selecting the minimum resistance. This increases the range of the applied DC offset and may cause the doubling of the minimum discrete level size. Alternatively, an initial code word of a one in the MSB and all zeros in the lower order bits can be applied to both sides to obtain the midrange code word. Subsequently, the codeword is modified on only one side of the differential pair. On one side of the differential pair, the codeword is only incremented whereas on the other side it is decremented. This technique has the advantage of having the same DC offset voltage range as the previous technique while maintaining a discrete step size of one unit resistor size.

Placing the tuning resistance array in series with the amplifier's load 805 has several merits. First, its noise is attenuated by the gain, or transconductance, of devices 806. Second, applying a discrete passive resistor 905 at this location is equivalent to modulating the source voltage of device of the input devices 806 while maintaining the current through that branch. Since the gate-to-source voltage is constant for a given current (to the first degree), increasing the source voltage for a constant current forces the gate voltage to increase as well. This in turn, directly modulates the input voltage levels without adding noisy resistors at the output directly. Third, adding passive linear elements such as resistors has the advantage of having low flicker noise and thus impacting the noise minimally at low frequencies. Preferably, the switches 807 comprise single metal oxide semiconductor (MOS) devices that are binary weighted with the same weight as each resistor element. Alternatively, any passive or active device may be applied instead of linear resistors. Also, alternatively, the weights on the steps sizes may be varied in any fashion that gives any desired increase (or decrease) in step size.

Figure 9:
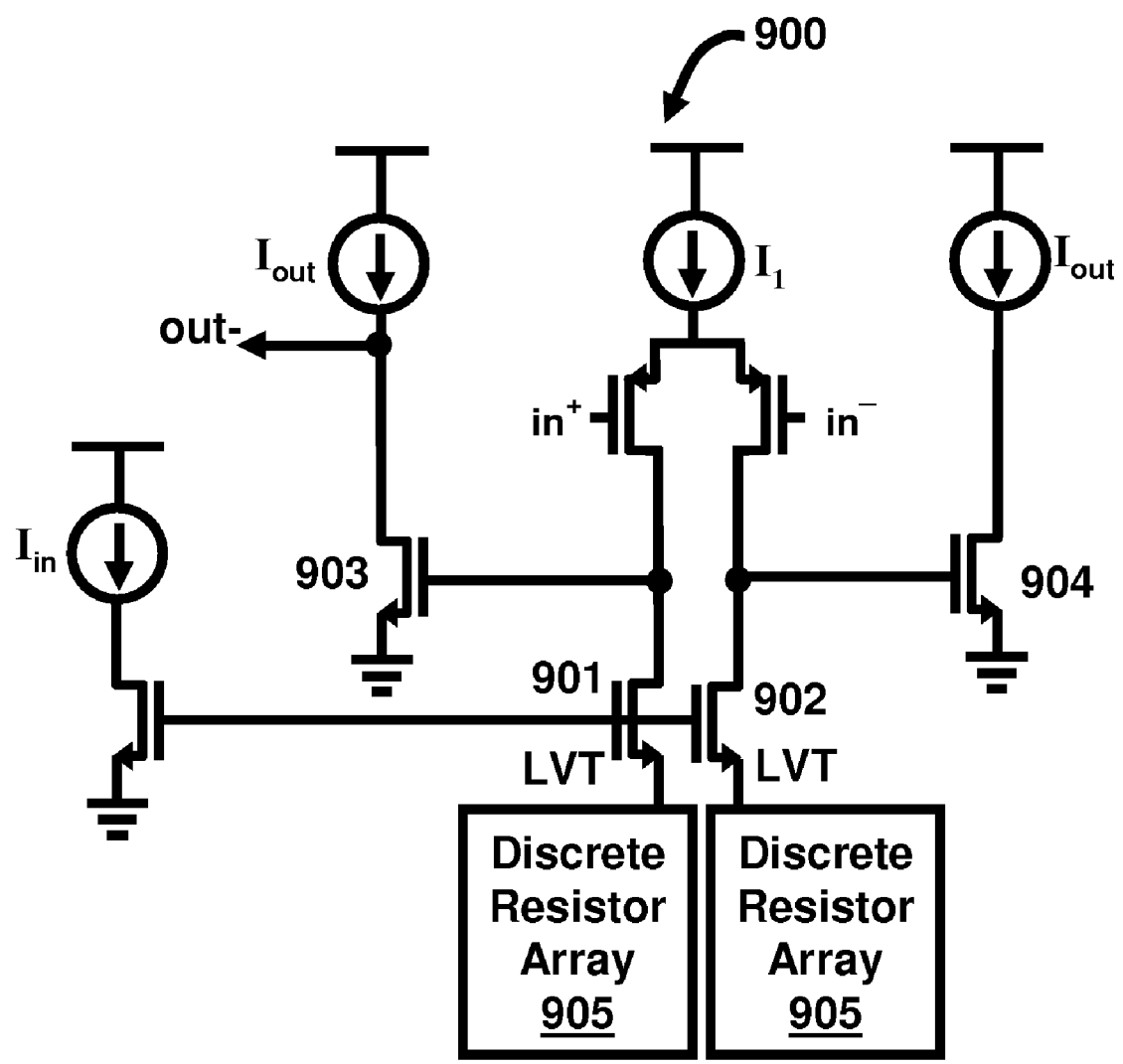
FIG. 9 illustrates a schematic diagram of a differential-input, differential-output operational amplifier using the discrete step generator according to an embodiment herein.

The embodiments herein can also be used for differential output operational amplifiers 900, as shown in FIG. 9. Unlike the previous case, transistors 901, 902 are both current mirrors. The maximum gate-to-source voltage ($V_{GS}$) on transistors 903, 904 is dictated by the output current, $I_{out}$, 905. If $V_{GS}$ is too high, transistors 903, 904 may enter the linear region and the operational amplifier 900 would not be functional. To prevent this from occurring transistors 901, 902 may be low-threshold voltage devices as shown in FIG. 9. As before, the resistor arrays 905 modulate the input voltage levels directly with the same merits as in the case of a differential input, single-ended output of the operational amplifier 900. The resistor array topology can be extended to any kind of amplifier, including voltage mode amplifiers, current mode amplifiers, transconductance amplifiers, transimpedance amplifiers, switched capacitor amplifiers, etc.

Figure 10:
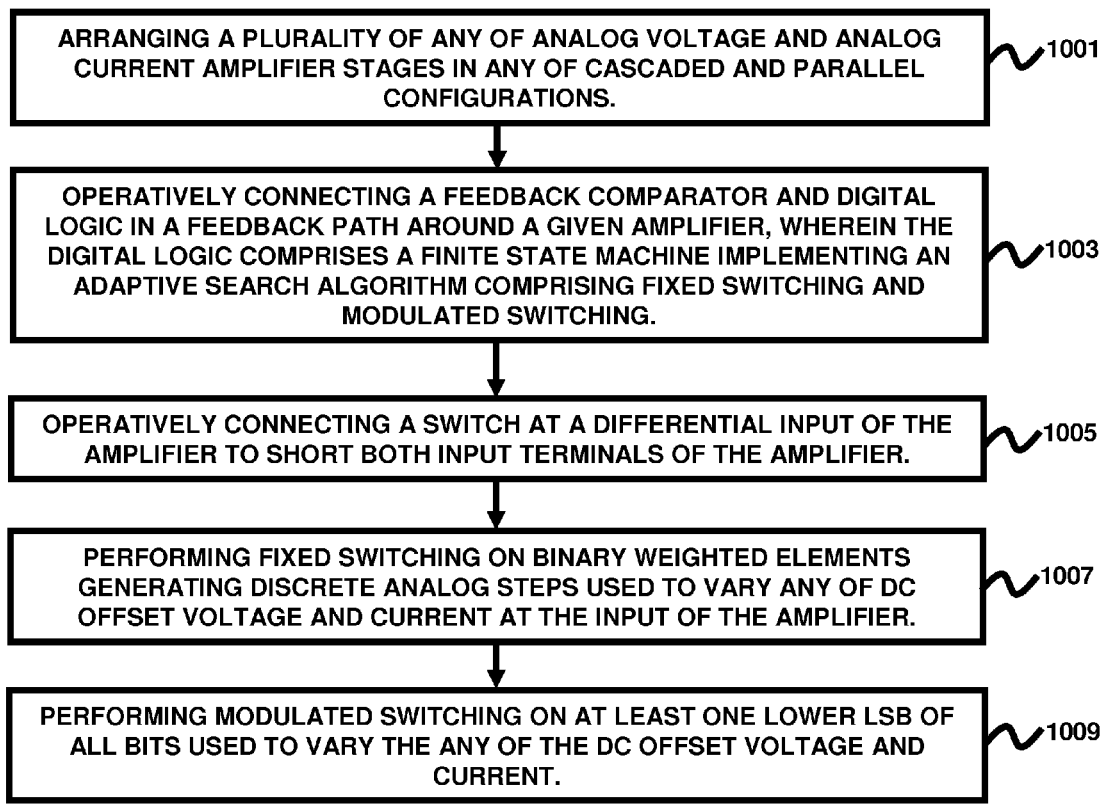
FIG. 10 is a flow diagram illustrating a preferred method according to an embodiment herein.

FIG. 10, with reference to FIGS. 4 through 9, is a flow diagram illustrating a method of canceling DC offset errors in cascaded amplifiers (401, 402, 403) according to an embodiment herein, wherein the method comprises arranging (1001) a plurality of any of analog voltage and analog current amplifier stages (401, 402, 403) in any of cascaded and parallel configurations; operatively connecting (1003) a feedback comparator 411 and digital logic 710 in a feedback path around a given amplifier (800 or 900), wherein the digital logic 710 comprises a finite state machine 700 implementing an adaptive search algorithm comprising fixed switching and modulated switching; operatively connecting (1005) a switch 807 at a differential input 806 of the amplifier 800 to short both input terminals 806 of the amplifier 800; performing (1007) fixed switching on binary weighted elements 803, 804 generating discrete analog steps used to vary any of DC offset voltage and current at the input of the amplifier 800; and performing (1009) modulated switching on at least one lower LSB 501 of all bits used to vary the any of the DC offset voltage and current.

Preferably, the feedback comparator 411 and the digital logic 710 are configured around each amplifier (401 or 402 or 403) in a network 406 of any of the cascaded and parallel amplifier stages 406. Additionally, the feedback comparator 411 and the digital logic 710 may be shared for each amplifier (401 or 402 or 403) in the network 406 of any of the cascaded and parallel amplifier stages, wherein a first stage 401 in a chain of amplifiers 406 is calibrated first, followed by a second stage amplifier 402, up to a Nth stage 403 in a cascade of N amplifier stages 406. Preferably, the modulating process is performed by any of a carry out signal of an accumulator 710 clocked with a high-speed clock CLK2 716 and by an output signal of a digital sigma-delta modulator 720, wherein the digital sigma-delta modulator 720 may comprise any of a single-bit, multi-bit, MASH, single-loop, and any other digital sigma-delta modulator architecture.

The method may further comprise using only one switch 807 for shorting the differential input terminals 806 of a first amplifier 401 in a cascade of amplifiers 406, wherein during DC offset error cancellation, the switch 807 is closed and a DC offset error cancellation algorithm is run on each amplifier 401, 402, 403 in series starting from the first amplifier 401 in a chain of amplifiers 406 proceeding to a last amplifier 403. Preferably, the adaptive search algorithm comprises any of a binary search algorithm 412 and a linear search algorithm, wherein in the binary search algorithm 412, a MSB 503 is first asserted, wherein the adaptive search algorithm preferably runs such that if an output voltage is less than a reference mode voltage, then the MSB 503 is deasserted, and preferably wherein if the output voltage is greater than the reference mode voltage, then the MSB 503 is asserted. Additionally, the binary search algorithm 412 preferably restarts with a second MSB 502 and continues down to the LSB 501.

The techniques provided by the embodiments herein may be implemented in an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other lowend applications to advanced computer products having a display, a keyboard or other input device, and a central processor.

Generally, the embodiments herein provide a technique that enables the implementation of a DC offset correction method and apparatus. This is demonstrated by differential input amplifiers 401, 402, 403 with both single-ended and differential outputs. The implemented circuit achieves DC offset cancellation that is achieved digitally with precision exceeding the limitation set by random device mismatches. The amplifiers 401, 402, 403 realized with such techniques can be made tolerant to random and systematic mismatches that adversely affect the DC offset.

The technique provided by the embodiments herein can be applied to all circuits that have a gain that is a function of resistor array elements (or transconductances). Therefore, the technique provided by the embodiments herein can apply to the design of very high-precision instrumentation circuitry. The embodiments herein can also be implemented in technologies other than complementary metal oxide semiconductors (CMOS) such as BICMOS, silicon germanium (SiGe), bipolar, and gallium arsenide (GaAs), for example. Furthermore, the embodiments herein may be used in the design/implementation of any receiver/transmitter (for example, wireless, TV tuner, cell phone, satellite tuner, etc.) and can also be used in disk-drives, hearing aids, modems, wire line applications or in any application requiring the use of a DC offset cancellation loop.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of canceling DC offset errors in cascaded amplifiers, said method comprising:
    arranging a plurality of any of analog voltage and analog current amplifier stages in any of cascaded and parallel configurations;
    operatively connecting a feedback comparator and digital logic in a feedback path around a given amplifier, wherein said digital logic comprises a finite state machine implementing an adaptive search algorithm comprising fixed switching and modulated switching;
    operatively connecting a switch at a differential input of said amplifier to short both input terminals of said amplifier;
    performing fixed switching on binary weighted elements generating discrete analog steps used to vary any of DC offset voltage and current at said input of said amplifier; and
    performing modulated switching on at least one lower least significant bit (LSB) of all bits used to vary said any of said DC offset voltage and current.

2. The method of claim 1, wherein said feedback comparator and said digital logic are configured around each said amplifier in a network of any of the cascaded and parallel amplifier stages.

3. The method of claim 1, wherein said feedback comparator and said digital logic are shared for each said amplifier in a network of any of the cascaded and parallel amplifier stages, wherein a first stage in a chain of amplifiers is calibrated first, followed by a second stage amplifier, up to a Nth stage in a cascade of N amplifier stages.

4. The method of claim 1, wherein the modulating process is performed by any of a carry out signal of an accumulator clocked with a high-speed clock and by an output signal of a digital sigma-delta modulator.

5. The method of claim 4, wherein said digital sigma-delta modulator comprises any of a single-bit, multi-bit, MASH, single-loop, and any other digital sigma-delta modulator architecture.

6. The method of claim 1, further comprising using only one switch for shorting the differential input terminals of a first amplifier in a cascade of amplifiers, wherein during DC offset error cancellation, said switch is closed and a DC offset error cancellation algorithm is run on each amplifier in series starting from said first amplifier in a chain of amplifiers proceeding to a last amplifier.

7. The method of claim 1, wherein said adaptive search algorithm comprises any of a binary search algorithm and a linear search algorithm, wherein in said binary search algorithm, a most significant bit (MSB) is first asserted.

8. The method of claim 7, wherein said adaptive search algorithm runs such that if an output voltage is less than a reference mode voltage, then said MSB is deasserted.

9. The method of claim 8, wherein if said output voltage is greater than said reference mode voltage, then said MSB is asserted.

10. The method of claim 9, wherein said binary search algorithm restarts with a second MSB and continues down to said LSB.

11. A circuit for canceling DC offset errors in cascaded amplifiers, said circuit comprising:
    a plurality of any of analog voltage and analog circuit amplifier stages arranged in any of cascaded and parallel configurations;
    a feedback path around a given amplifier, wherein said feedback path comprises a feedback comparator and digital logic, wherein said digital logic comprises a finite state machine implementing an adaptive search algorithm comprising fixed switching and modulated switching; and
    a switch operatively connected at a differential input of said amplifier to short both input terminals of said amplifier,
    wherein said fixed switching is performed on binary weighted elements generating discrete analog steps used to vary any of DC offset voltage and current at said input of said amplifier, and
    wherein said modulated switching is performed on at least one lower least significant bit (LSB) of all bits used to vary said any of said DC offset voltage and current.

12. The circuit of claim 11, wherein said feedback comparator and said digital logic are configured around each said amplifier in a network of any of the cascaded and parallel amplifier stages.

13. The circuit of claim 11, wherein said feedback comparator and said digital logic are shared for each said amplifier in a network of any of the cascaded and parallel amplifier stages, wherein a first stage in a chain of amplifiers is calibrated first, followed by a second stage amplifier, up to a Nth stage in a cascade of N amplifier stages.

14. The circuit of claim 11, wherein the modulating process is performed by any of a carry out signal of an accumulator clocked with a high-speed clock and by an output signal of a digital sigma-delta modulator.

15. The circuit of claim 14, wherein said digital sigma-delta modulator comprises any of a single-bit, multi-bit, MASH, single-loop, and any other digital sigma-delta modulator architecture.

16. The circuit of claim 11, wherein only one switch shorting the differential input terminals of a first amplifier in a cascade of amplifiers is used, and wherein during DC offset error cancellation, said switch is closed and a DC offset error cancellation algorithm is run on each amplifier in series starting from said first amplifier in a chain of amplifiers proceeding to a last amplifier.

17. The circuit of claim 11, wherein said adaptive search algorithm comprises any of a binary search algorithm and a linear search algorithm, wherein in said binary search algorithm, a most significant bit (MSB) is first asserted.

18. The circuit of claim 17, wherein said adaptive search algorithm runs such that if an output voltage is less than a reference mode voltage, then said MSB is deasserted.

19. The circuit of claim 18, wherein if said output voltage is greater than said reference mode voltage, then said MSB is asserted.

20. The circuit of claim 19, wherein said binary search algorithm restarts with a second MSB and continues down to said LSB.

21. A system for canceling DC offset errors in cascaded amplifiers, said system comprising:
- a signal generator;
- a plurality of any of analog voltage and analog circuit amplifiers stages arranged in any of cascaded and parallel configurations and adapted to receive signals from said signal generator;
- a feedback path around a given amplifier, wherein said feedback path comprises a feedback comparator and digital logic, wherein said digital logic comprises a finite state machine implementing an adaptive search algorithm comprising fixed switching and modulated switching, wherein said feedback comparator and said digital logic are configured around each said amplifier in a network of any of the cascaded and parallel amplifier stages, wherein said feedback comparator and said digital logic are shared for each said amplifier in a network of any of the cascaded and parallel amplifier stages, wherein a first stage in a chain of amplifiers is calibrated first, followed by a second stage amplifier, up to a Nth stage in a cascade of N amplifier stages, wherein said adaptive search algorithm comprises any of a binary search algorithm and a linear search algorithm, wherein in said binary search algorithm, a most significant bit (MSB) is first asserted; and
- a switch operatively connected at a differential input of said amplifier to short both input terminals of said amplifier,
- wherein said fixed switching is performed on binary weighted elements generating discrete analog steps used to vary any of DC offset voltage and current at said input of said amplifier,
- wherein said modulated switching is performed on at least one lower least significant bit (LSB) of all bits used to vary said any of said DC offset voltage and current, and wherein the modulating process is performed by any of a carry out signal of an accumulator clocked with a high-speed clock and by an output signal of a digital sigma-delta modulator.

22. The system of claim 21, wherein said digital sigma-delta modulator comprises any of a single-bit, multi-bit, MASH, single-loop, and any other digital sigma-delta modulator architecture.

23. The system of claim 21, wherein said adaptive search algorithm runs such that if an output voltage is less than a reference mode voltage, then said MSB is deasserted.

24. The system of claim 23, wherein if said output voltage is greater than said reference mode voltage, then said MSB is asserted.

25. The system of claim 24, wherein said binary search algorithm restarts with a second MSB and continues down to said LSB.

\* \* \* \* \*